US010406635B2

(12) United States Patent
Hirata

(10) Patent No.: US 10,406,635 B2
(45) Date of Patent: *Sep. 10, 2019

(54) WAFER PRODUCING METHOD AND PROCESSING FEED DIRECTION DETECTING METHOD

(71) Applicant: DISCO CORPORATION, Tokyo (JP)

(72) Inventor: Kazuya Hirata, Tokyo (JP)

(73) Assignee: DISCO CORPORATTION, Tokyo (JP)

(*) Notice: Subject to any disclaimer, the term of this patent is extended or adjusted under 35 U.S.C. 154(b) by 209 days.

This patent is subject to a terminal disclaimer.

(21) Appl. No.: 15/475,982

(22) Filed: Mar. 31, 2017

(65) Prior Publication Data

US 2017/0291255 A1    Oct. 12, 2017

(30) Foreign Application Priority Data

Apr. 11, 2016   (JP) .................................. 2016-078613

(51) Int. Cl.
*C30B 29/36*      (2006.01)
*B23K 26/53*     (2014.01)
(Continued)

(52) U.S. Cl.
CPC .......... *B23K 26/53* (2015.10); *B23K 26/0006* (2013.01); *B23K 26/032* (2013.01);
(Continued)

(58) Field of Classification Search
CPC ................................ C30B 29/36; C30B 33/00
See application file for complete search history.

(56) References Cited

U.S. PATENT DOCUMENTS 5,223,692 A   6/1993  Lozier et al.
5,561,544 A  10/1996  Macken
(Continued)

FOREIGN PATENT DOCUMENTS

JP    2000-94221     4/2000
JP    2002373870 A  12/2002
(Continued)

OTHER PUBLICATIONS

Hirata et al., U.S. Appl. No. 14/955,352, filed Dec. 1, 2015.
(Continued)

*Primary Examiner* — Robert M Kunemund
(74) *Attorney, Agent, or Firm* — Greer Burns & Crain, Ltd.

(57) ABSTRACT

A wafer is produced from an ingot by confirming whether or not an inclined c-axis of the ingot and a second orientation flat of the ingot are perpendicular to each other, and detecting a processing feed direction perpendicular to the direction in which the c-axis is inclined. The method includes performing sampling irradiation of the ingot with a laser beam, along a direction parallel to the second orientation flat and a plurality of directions inclined clockwise and counterclockwise by respective predetermined angles from the second orientation flat, thereby forming a plurality of sampled reduced strength areas in the ingot; measuring the number of nodes which exist per unit length on each of the sampled reduced strength areas, and determining a direction in which the sampled reduced strength area where the measured number of nodes is zero extends as a processing feed direction.

2 Claims, 8 Drawing Sheets

(51) Int. Cl.
  *B23K 26/00* (2014.01)
  *B23K 26/03* (2006.01)
  *B28D 5/00* (2006.01)
  *C30B 33/04* (2006.01)
  *B23K 26/08* (2014.01)
  *B23K 26/0622* (2014.01)
  *B23K 103/00* (2006.01)
  *H01L 29/16* (2006.01)

(52) U.S. Cl.
  CPC ...... *B23K 26/0622* (2015.10); *B23K 26/0823* (2013.01); *B23K 26/0853* (2013.01); *B28D 5/0011* (2013.01); *C30B 29/36* (2013.01); *C30B 33/04* (2013.01); *B23K 2103/56* (2018.08); *H01L 29/1608* (2013.01)

(56) References Cited

U.S. PATENT DOCUMENTS

| | | |
|---|---|---|
| 5,581,572 A | 12/1996 | Delorme et al. |
| 5,912,186 A | 6/1999 | Yoshino et al. |
| 6,720,522 B2 | 4/2004 | Ikegami et al. |
| 7,160,790 B2 | 1/2007 | Henley et al. |
| 7,374,955 B2 | 5/2008 | Izumome |
| 7,566,635 B2 | 7/2009 | Fujii et al. |
| 7,737,001 B2 | 6/2010 | Abe et al. |
| 7,892,949 B2 | 2/2011 | Abe et al. |
| 8,148,184 B2 | 4/2012 | Koyanagi et al. |
| 8,263,479 B2 | 9/2012 | Fukuyo et al. |
| 8,415,234 B2 | 4/2013 | Abatake |
| 8,722,516 B2 | 5/2014 | Yamada et al. |
| 8,790,997 B2 | 7/2014 | Nakagawa et al. |
| 8,815,705 B2 | 8/2014 | Kato |
| 9,138,913 B2 | 9/2015 | Arai et al. |
| 9,174,305 B2 | 11/2015 | Morikazu et al. |
| 9,193,008 B2 | 11/2015 | Morikazu et al. |
| 9,478,696 B2 | 10/2016 | Tajikara et al. |
| 9,481,051 B2 | 11/2016 | Hirata et al. |
| 9,488,831 B2 | 11/2016 | Ito et al. |
| 9,517,530 B2 | 12/2016 | Hirata et al. |
| 9,620,415 B2 | 4/2017 | Hirata et al. |
| 9,757,815 B2 | 9/2017 | Hosseini |
| 9,789,565 B2 | 10/2017 | Hirata et al. |
| 9,850,160 B2 | 12/2017 | Marjanovic et al. |
| 9,868,177 B2 * | 1/2018 | Hirata ................ B23K 26/0604 |
| 9,878,397 B2 * | 1/2018 | Hirata ................ B23K 37/0235 |
| 2003/0141505 A1 | 7/2003 | Isobe et al. |
| 2004/0002199 A1 | 1/2004 | Fukuyo et al. |
| 2004/0144301 A1 | 7/2004 | Neudeck et al. |
| 2005/0199592 A1 | 9/2005 | Iri et al. |
| 2005/0217560 A1 | 10/2005 | Tolchinsky et al. |
| 2006/0008941 A1 | 1/2006 | Haskell et al. |
| 2006/0079155 A1 | 4/2006 | Nakamura et al. |
| 2006/0148210 A1 | 7/2006 | Furuta et al. |
| 2006/0258047 A1 | 11/2006 | Nishiwaki et al. |
| 2007/0111480 A1 | 5/2007 | Maruyama et al. |
| 2007/0284764 A1 | 12/2007 | Sekiya |
| 2008/0008641 A1 | 1/2008 | Leonard et al. |
| 2008/0062430 A1 | 3/2008 | Horvath et al. |
| 2008/0070380 A1 | 3/2008 | Kusunoki |
| 2009/0056513 A1 | 3/2009 | Baer |
| 2009/0117712 A1 | 5/2009 | Sakamoto et al. |
| 2009/0127233 A1 | 5/2009 | Asano et al. |
| 2009/0320897 A1 | 12/2009 | Shimomura |
| 2010/0203706 A1 | 8/2010 | Ohnuma et al. |
| 2011/0193269 A1 | 8/2011 | Ito et al. |
| 2011/0195536 A1 | 8/2011 | Koyanagi et al. |
| 2011/0195537 A1 | 8/2011 | Koyanagi et al. |
| 2011/0298084 A1 | 12/2011 | Tamemoto |
| 2012/0055546 A1 | 3/2012 | Turner |
| 2012/0111495 A1 | 5/2012 | Shimoi et al. |
| 2012/0289028 A1 | 11/2012 | Abatake |
| 2012/0298636 A1 | 11/2012 | Nomaru et al. |
| 2013/0037825 A1 | 2/2013 | Hiraiwa et al. |
| 2013/0171402 A1 | 7/2013 | Straubinger et al. |
| 2013/0248500 A1 | 9/2013 | Shreter et al. |
| 2014/0001679 A1 | 1/2014 | Okuma et al. |
| 2014/0038392 A1 | 2/2014 | Yonehara et al. |
| 2015/0038062 A1 | 2/2015 | Umeda et al. |
| 2015/0121960 A1 | 5/2015 | Hosseini |
| 2015/0376813 A1 | 12/2015 | Tsuchida et al. |
| 2016/0052090 A1 | 2/2016 | Tanigawa |
| 2016/0093763 A1 | 3/2016 | Rana et al. |
| 2016/0121426 A1 | 5/2016 | Hollinger et al. |
| 2016/0126138 A1 | 5/2016 | Morikazu et al. |
| 2016/0158881 A1 | 6/2016 | Hirata et al. |
| 2016/0158882 A1 | 6/2016 | Hirata et al. |
| 2016/0163549 A1 | 6/2016 | Okuma et al. |
| 2016/0228984 A1 | 8/2016 | Hirata et al. |
| 2016/0293397 A1 | 10/2016 | Hirata et al. |
| 2016/0354862 A1 | 12/2016 | Hirata |
| 2016/0354863 A1 | 12/2016 | Hirata |
| 2017/0015017 A1 | 1/2017 | Hirata |
| 2017/0053829 A1 | 2/2017 | Hirata et al. |
| 2017/0250113 A1 | 8/2017 | Vanagas et al. |
| 2017/0355041 A1 | 12/2017 | Yamashita et al. |

FOREIGN PATENT DOCUMENTS

| | | |
|---|---|---|
| JP | 2007019379 A | 1/2007 |
| JP | 2013-49161 | 3/2013 |

OTHER PUBLICATIONS

Hirata et al., U.S. Appl. No. 14/955,306, filed Dec. 1, 2015.
Hirata, et al., U.S. Appl. No. 14/953,718, filed Nov. 30, 2015.
Hirata et al., U.S. Appl. No. 14/953,679, filed Nov. 30, 2015.
Hirata et al., U.S. Appl. No. 14/988,310, filed Jan. 5, 2016.
Hirata et al., U.S. Appl. No. 14/988,378, filed Jan. 5, 2016.
Hirata et al., U.S. Appl. No. 15/015,852, filed Feb. 4, 2016.
Hirata et al., U.S. Appl. No. 15/014,367, filed Feb. 3, 2016.
Hirata et al., U.S. Appl. No. 15/015,532, filed Feb. 4, 2016.
Hirata et al., U.S. Appl. No. 15/088,386, filed Apr. 1, 2016.
Hirata et al., U.S. Appl. No. 15/083,635, filed Mar. 29, 2016.
Hirata et al., U.S. Appl. No. 15/088,441, filed Apr. 1, 2016.
Hirata, Kazuya, U.S. Appl. No. 15/165,686, filed May 26, 2016.
Hirata, Kazuya, U.S. Appl. No. 15/165,259, filed May 26, 2016.
Hirata, Kazuya, U.S. Appl. No. 15/205,644, filed Jul. 8, 2016.
Hirata et al., U.S. Appl. No. 15/209,292, filed Jul. 13, 2016.
Hirata, Kazuya, U.S. Appl. No. 15/212,513, filed Jul. 18, 2016.
Hirata, Kazuya, U.S. Appl. No. 15/397,386, filed Jan. 3, 2017.
Hirata, Kazuya, U.S. Appl. No. 15/472,945, filed Mar. 29, 2017.
Hirata, Kazuya, U.S. Appl. No. 15/237,115, filed Aug. 15, 2016.
Yoshida et al., Dependences of Laser-Induced Bulk Damage Threshold and Crack Patterns in several Nonlinear Crystals on Irradiation Direction, Feb. 8, 2006, Japanese Journal of Applied Physics, vol. 45, No. 2A, pp. 766-769.

* cited by examiner

WAFER PRODUCING METHOD AND PROCESSING FEED DIRECTION DETECTING METHOD

BACKGROUND OF THE INVENTION

Field of the Invention

The present invention relates to a wafer producing method of producing a wafer from a single-crystal SiC ingot and a processing feed direction detecting method of detecting a processing feed direction perpendicular to the direction in which a c-axis is inclined at the time a wafer is produced from a single-crystal SiC ingot.

Description of the Related Art

Devices such as integrated circuits (ICs), large scale integration (LSI) circuits, light emitting diodes (LEDs), etc. are produced by depositing functional layers on the upper surface of a wafer made of Si (silicon), $Al_2O_3$ (sapphire), or the like, and demarcating the functional layers along projected dicing lines. Power devices, LEDs, etc. are produced by depositing functional layers on the upper surface of a wafer made of single-crystal SiC (silicon carbide), and demarcating the functional layers along projected dicing lines. The wafers are diced into individual devices along the projected dicing lines by a cutting apparatus or a laser processing apparatus. The devices will be used in various electric appliances such as mobile phones, personal computers, etc.

Generally, a wafer on which to form devices is produced by slicing a cylindrically shaped ingot into a thin piece with a wire saw. The produced wafer has its upper and lower surfaces polished to a mirror finish (see Japanese Patent Laid-open No. 2000-94221). One problem with slicing an ingot into a wafer with a wire saw and polishing the upper and lower surfaces of the wafer is that it is uneconomical because most (70% through 80%) of the ingot has to be thrown away. In particular, single-crystal SiC ingots have high hardness and have a productivity problem because slicing them with a wire saw is a difficult task to perform and takes a considerable period of time, are highly costly each, and present an obstacle to the efficient generation of wafers.

There has been proposed a technology for applying a laser beam having a wavelength that transmits SiC to an SiC ingot while having a focused point within the SiC ingot, thereby forming a modified layer in a projected cutting plane in the SiC ingot, and cutting the SiC ingot along the projected cutting plane where the modified layer has been formed, thus producing a wafer from the SiC ingot (see Japanese Patent Laid-open No. 2013-49161). However, producing wafers from an SiC ingot suffers poor productivity as a number of adjacent modified layers need to be formed in the SiC ingot.

SUMMARY OF THE INVENTION

It is an object of the present invention to provide a wafer producing method that can improve productivity.

Another object of the present invention is to provide a processing feed direction detecting method making it possible to carry out the wafer producing method that can improve productivity.

In accordance with an aspect of the present invention, there is provided a wafer producing method of producing a wafer from a cylindrical single-crystal SiC ingot having a cylindrical peripheral surface including a first orientation flat and a second orientation flat shorter than the first orientation flat and perpendicular to the first orientation flat, and a circular upper surface, the cylindrical single-crystal SiC ingot having a c-axis inclined from a vertical axis perpendicular to the circular upper surface toward the second orientation flat and an off-angle formed between a c-plane perpendicular to the c-axis and the upper surface. The wafer producing method includes: a processing feed direction detecting step of confirming whether or not a direction in which the c-axis is inclined and the second orientation flat are perpendicular to each other, and detecting a processing feed direction perpendicular to the direction in which the c-axis is inclined; a reduced strength area forming step of positioning the focused point of a laser beam in the cylindrical single-crystal SiC ingot at a depth from the circular upper surface, which depth corresponds to the thickness of a wafer to be produced, and while relatively moving the cylindrical single-crystal SiC ingot and the focused point in the processing feed direction which has been detected in the processing feed direction detecting step, irradiating the cylindrical single-crystal SiC ingot with a laser beam having a wavelength that transmits SiC, thereby forming a straight reduced strength area made up of a modified layer parallel to the circular upper surface and cracks extending from the modified layer along the c-plane at the depth corresponding to the thickness of the wafer to be produced; a peeling plane forming step of forming a peeling plane in the cylindrical single-crystal SiC ingot by carrying out the reduced strength area forming step a plurality of times at predetermined intervals in a direction perpendicular to the processing feed direction; and a wafer producing step of, after the peeling plane forming step, producing a wafer from the cylindrical single-crystal SiC ingot by peeling off a portion of the cylindrical single-crystal SiC ingot from the peeling plane that serves as a boundary face. The processing feed direction detecting step includes: a sampling step of performing sampling irradiation for positioning the focused point of a laser beam in the cylindrical single-crystal SiC ingot at a predetermined depth from the circular upper surface and, while moving the cylindrical single-crystal SiC ingot and the focused point relatively to each other, irradiating the cylindrical single-crystal SiC ingot with a laser beam having a wavelength that transmits SiC, along a direction parallel to the second orientation flat and a plurality of directions inclined clockwise and counterclockwise by respective predetermined angles from the second orientation flat, thereby forming a plurality of straight sampled reduced strength areas in the cylindrical single-crystal SiC ingot, each of the straight sampled reduced strength areas being made up of a modified layer parallel to the circular upper surface and cracks extending from the modified layer along the c-plane; and a determining step of capturing respective images of the straight sampled reduced strength areas with imaging means, measuring the number of nodes which exist per unit length on each of the straight sampled reduced strength areas in one of the images thereof, and determining a direction in which the straight sampled reduced strength area where the measured number of nodes is zero extends as a processing feed direction.

In accordance with another aspect of the present invention, there is provided a processing feed direction detecting method of detecting a processing feed direction in producing a wafer from a cylindrical single-crystal SiC ingot having a cylindrical peripheral surface including a first orientation flat and a second orientation flat shorter than the first orientation flat and perpendicular to the first orientation flat, and a circular upper surface, the cylindrical single-crystal SiC ingot having a c-axis inclined from a vertical axis perpendicular to the circular upper surface toward the second orientation flat and an off-angle formed between a c-plane perpendicular to the c-axis and the upper surface. The processing feed direction detecting method includes: a sampling step of performing sampling irradiation for positioning the focused point of a laser beam in the cylindrical single-crystal SiC ingot at a predetermined depth from the circular upper surface and, while moving the cylindrical single-crystal SiC ingot and the focused point relatively to each other, irradiating the cylindrical single-crystal SiC ingot with a laser beam having a wavelength that transmits SiC, along a direction parallel to the second orientation flat and a plurality of directions inclined clockwise and counterclockwise by respective predetermined angles from the second orientation flat, thereby forming a plurality of straight sampled reduced strength areas in the cylindrical single-crystal SiC ingot, each of the straight sampled reduced strength areas being made up of a modified layer parallel to the circular upper surface and cracks extending from the modified layer along the c-plane; and a determining step of capturing respective images of the straight sampled reduced strength areas with imaging means, measuring the number of nodes which exist per unit length on each of the straight sampled reduced strength areas in one of the images thereof, and determining a direction in which the straight sampled reduced strength area where the measured number of nodes is zero extends as a processing feed direction.

The wafer producing method according to the present invention is capable of producing a wafer having a desired thickness by peeling off a portion of the single-crystal SiC ingot from the peeling plane serving as a boundary plane. Wafers can efficiently be produced from the single-crystal SiC ingot. The amount of wafer material that has to be thrown away is reduced. Wafers can be produced from the single-crystal SiC ingot with improved productivity.

The processing feed direction detecting method according to the present invention determines a direction in which the straight sampled reduced strength area where the measured number of nodes is zero extends as a processing feed direction. Therefore, the processing feed direction is made perpendicular to the direction in which the c-axis is inclined. Consequently, a peeling plane of good quality can reliably be formed for the generation of wafers from the single-crystal SiC ingot.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
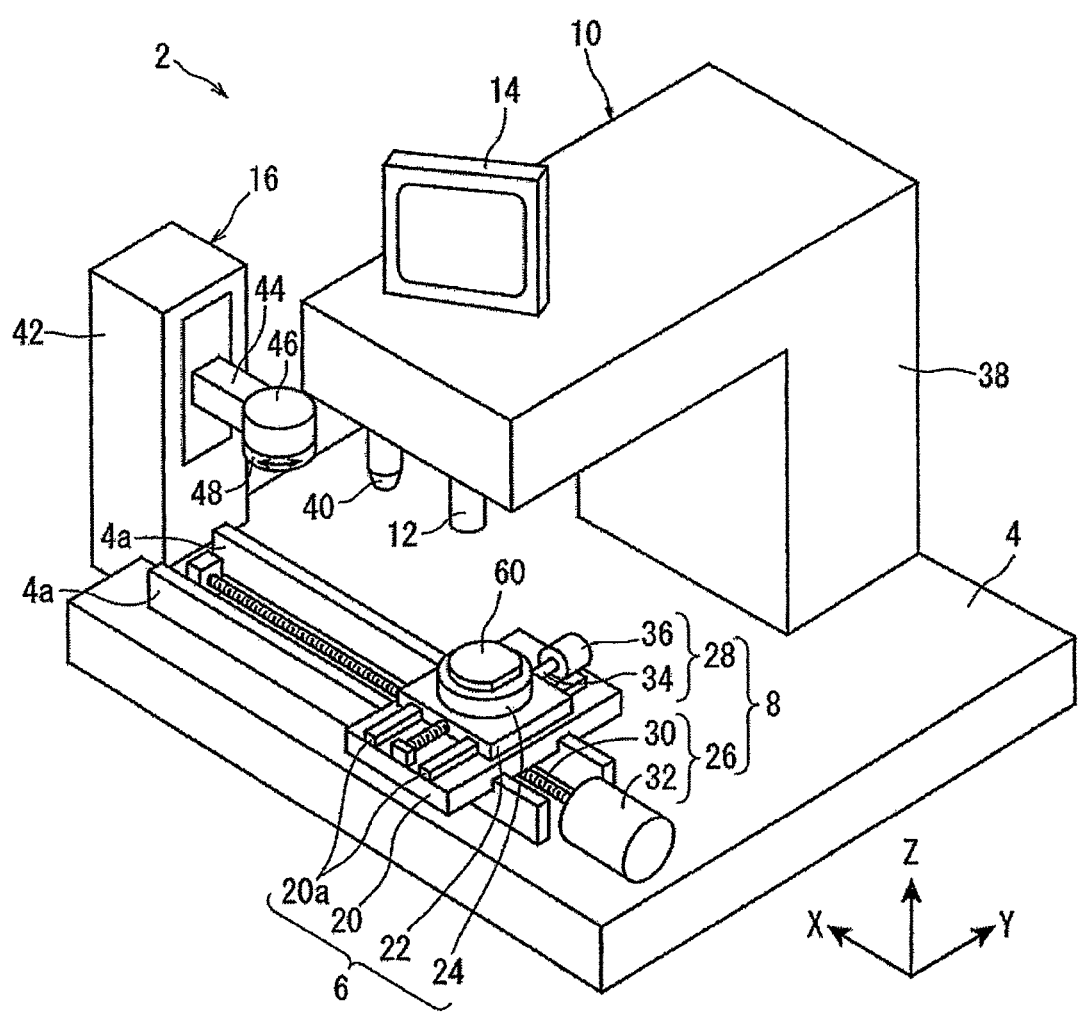
FIG. 1 is a perspective view of a laser processing apparatus.

A wafer producing method and a processing feed direction detecting method according to a preferred embodiment of the present invention will be described below with reference to the drawings. First, a laser processing apparatus 2 shown in FIGS. 1 and 2 and a hexagonal single-crystal SiC ingot 60 shown in FIGS. 3A and 3B, which are to be used in the methods, will be described below. As shown in FIG. 1, a laser processing apparatus 2 has a base table 4, holding means 6 for holding a workpiece, moving means 8 for moving the holding means 6, laser beam applying means 10, imaging means 12, display means 14, peeling means 16, and control means 18.

The holding means 6 includes a rectangular X-direction movable plate 20 mounted on the base table 4 for movement in X directions, a rectangular Y-direction movable plate 22 mounted on the X-direction movable plate 20 for movement in Y directions, and a cylindrical chuck table 24 rotatably mounted on an upper surface of the Y-direction movable plate 22. The X directions refer to directions indicated by the arrow X in FIG. 1, and the Y directions refer to directions indicated by the arrow Y in FIG. 1 and are perpendicular to the X directions. The X and Y directions jointly define a plane which is essentially a horizontal plane.

The moving means 8 includes X-direction moving means 26, Y-direction moving means 28, and rotating means (not shown). The X-direction moving means 26 has a ball screw 30 extending in the X directions over the base table 4 and a motor 32 coupled to an end of the ball screw 30. The ball screw 30 is threaded through a nut (not shown) fixed to a lower surface of the X-direction movable plate 20. When the motor 32 is energized, the ball screw 30 converts rotary motion of the motor 32 into linear motion and transmits the linear motion to the X-direction movable plate 20, moving the X-direction movable plate 20 selectively in one or the other of the X directions along a pair of guide rails 4a on the base table 4. The Y-direction moving means 28 has a ball screw 34 extending in the Y directions over the X-direction movable plate 20 and a motor 36 coupled to an end of the ball screw 34. The ball screw 34 is threaded through a nut (not shown) fixed to a lower surface of the Y-direction movable plate 22. When the motor 36 is energized, the ball screw 34 converts rotary motion of the motor 36 into linear motion and transmits the linear motion to the Y-direction movable plate 22, moving the Y-direction movable plate 22 selectively in one or the other of the Y directions along a pair of guide rails 20a on the X-direction movable plate 20. The rotating means has a motor (not shown) housed in the chuck table 24. When energized, the motor rotates the chuck table 24 about its own axis with respect to the Y-direction movable plate 22.

The laser beam applying means 10 includes a frame 38 mounted on an upper surface of the base table 4 and having an overhanging arm extending substantially horizontally, pulsed laser beam oscillating means (not shown) housed in the frame 38, a beam condenser 40 disposed on a lower surface of the distal end of the overhanging arm of the frame 38, and focused point position adjusting means (not shown). The pulsed laser beam oscillating means has a pulsed laser beam oscillator, output power adjusting means for adjusting the output power of a pulsed laser beam, and setting means for setting a repetitive frequency of the pulsed laser beam. These components of the pulsed laser beam oscillating means are omitted from illustration. The beam condenser 40 has a condensing lens (not shown) for converging a pulsed laser beam emitted from the pulsed laser beam oscillating means.

The imaging means 12 is mounted on the lower surface of the distal end of the overhanging arm of the frame 38 and spaced from the beam condenser 40 in the X directions. The imaging means 12 includes an ordinary imaging device (charge coupled device (CCD)) for capturing images with visible light, infrared radiation applying means for applying an infrared radiation to a workpiece, an optical system for capturing the infrared radiation applied from the infrared radiation applying means, and an imaging device (infrared CCD) for outputting an electric signal representing the infrared radiation captured by the optical system. These components of the imaging means 12 are omitted from illustration. The display means 14, which displays images captured by the imaging means 12, is mounted on an upper surface of the distal end of the overhanging arm of the frame 38.

The peeling means 16 includes a casing 42 mounted on the base table 4 and extending upwardly from ends of the guide rails 4a and an arm 44 extending along the X directions from the casing 42. The arm 44 has a proximal end coupled to the casing 42 for movement in Z directions. The Z directions refer to directions indicated by the arrow Z in FIG. 1 and are perpendicular to the X and Y directions. The casing 42 houses therein Z-direction moving means (not shown) for moving the arm 44 selectively in one or the other of the Z directions. A motor 46 is mounted on the distal end of the arm 44. A disk-shaped suction member 48 is coupled to a lower surface of the motor 46 for rotation about an axis along the Z directions. The suction member 48 has a plurality of suction holes (not shown) defined in a lower surface (suction surface) thereof and connected to suction means (not shown) by fluid passageways (not shown). The suction member 48 houses therein ultrasonic vibration applying means (not shown) for applying ultrasonic vibrations to the lower surface of the suction member 48.

Figure 2:
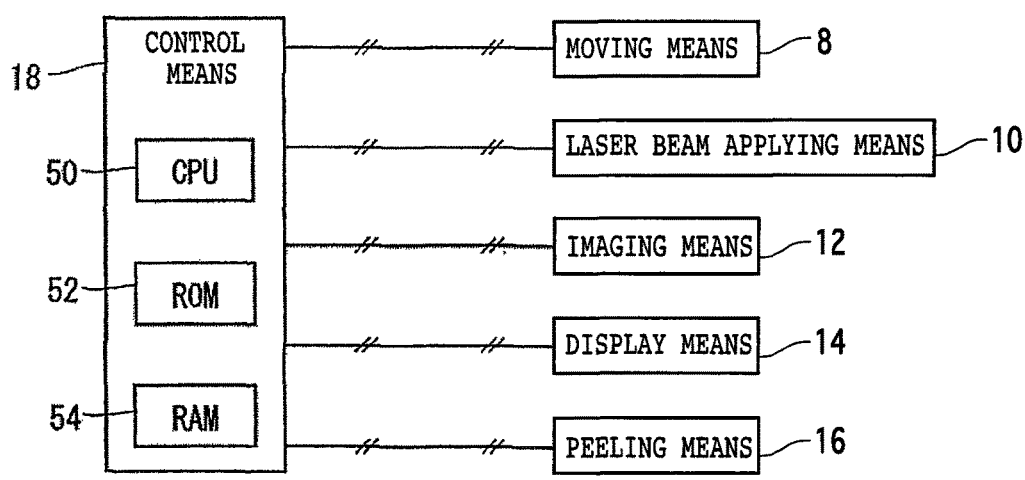
FIG. 2 is a block diagram showing an electric make-up of the laser processing apparatus shown in FIG. 1.

As shown in FIG. 2, the control means 18, which includes a computer, includes a central processing unit (CPU) 50 for performing processing operations according to a control program, a read only memory (ROM) 52 for storing the control program, etc., and a random access memory (RAM) 54, which allows data to be written to and read from, for storing the results of the processing operations, etc. The control means 18 is electrically connected to the moving means 8, the laser beam applying means 10, the imaging means 12, the display means 14, and the peeling means 16, and controls these means.

Figure 3A:
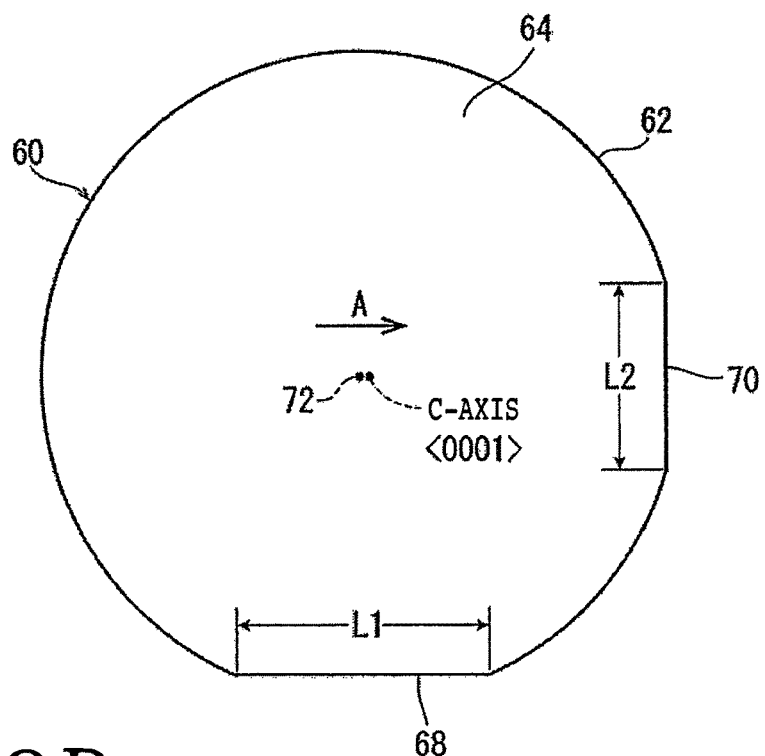
FIG. 3A is a plan view of a single-crystal SiC ingot.
Figure 3B:
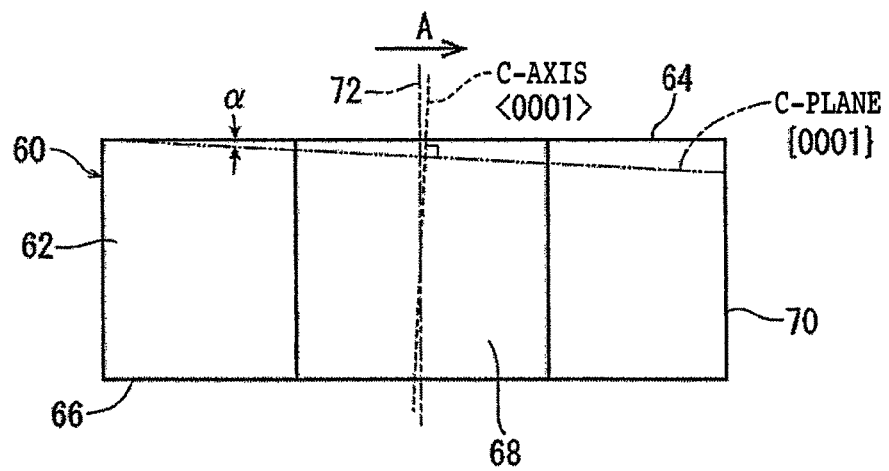
FIG. 3B is a front elevational view of the single-crystal SiC ingot.

FIGS. 3A and 3B show a hexagonal single-crystal SiC ingot 60 (hereinafter referred to as "ingot 60") which is of a cylindrical shape having a cylindrical peripheral surface 62 and circular upper and lower surfaces 64 and 66. The peripheral surface 62 includes a rectangular first orientation flat 68 and a rectangular second orientation flat 70 which indicate crystal orientations. As viewed in the direction of a vertical axis 72 perpendicular to the upper surface 64, the length L2 of the second orientation flat 70 is smaller than the length L1 of the first orientation flat 68 (L2<L1). The first orientation flat 68 and the second orientation flat 70 are perpendicular to each other. The ingot 60 has a c-axis (<0001> direction) inclined from the vertical axis 72 toward the second orientation flat 70 (the direction in which the c-axis is inclined is indicated by the arrow A), and has an off-angle α formed between a c-plane ({0001} plane) perpendicular to the c-axis and the upper surface 64. On the hexagonal single-crystal SiC ingot 60, normally, the second orientation flat 70 is formed perpendicularly to the direction A in which the c-axis is inclined.

Now, a wafer producing method and a processing feed direction detecting method of detecting a processing feed direction at the time a wafer is produced, which use the laser processing apparatus 2 and the ingot 60, will be described below. First, as shown in FIG. 1, the ingot 60 is secured to the chuck table 24 with an adhesive, e.g., an epoxy-resin adhesive, interposed between the lower surface 66 of the ingot 60 and the upper surface of the chuck table 24.

After the ingot 60 has been secured to the chuck table 24, an alignment step is carried out. In the alignment step, the moving means 8 moves the chuck table 24 under the imaging means 12, and the imaging means 12 captures an image of the ingot 60. Then, based on the image of the ingot 60 captured by the imaging means 12, the first orientation flat 68 and the second orientation flat 70 are detected. The moving means 8 then moves and rotates the chuck table 24 to position the ingot 60 into alignment with the beam condenser 40. Thereafter, the focused point position adjusting means moves the beam condenser 40 in the Z directions to adjust the focused point of a pulsed laser beam to a position in the ingot 60 which is spaced a predetermined depth from the upper surface 64 of the ingot 60, i.e., a position at a depth corresponding to the thickness of a wafer to be produced.

Figure 4A:
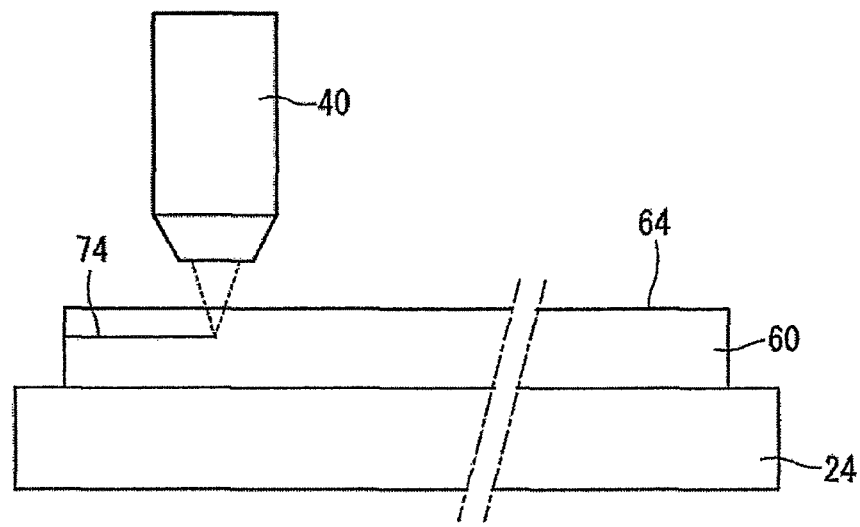
FIG. 4A is an elevational view, partly in fragmentary cross section, showing the manner in which a sampling step of a processing feed direction detecting step is carried out on the single-crystal SiC ingot.
Figure 4B:
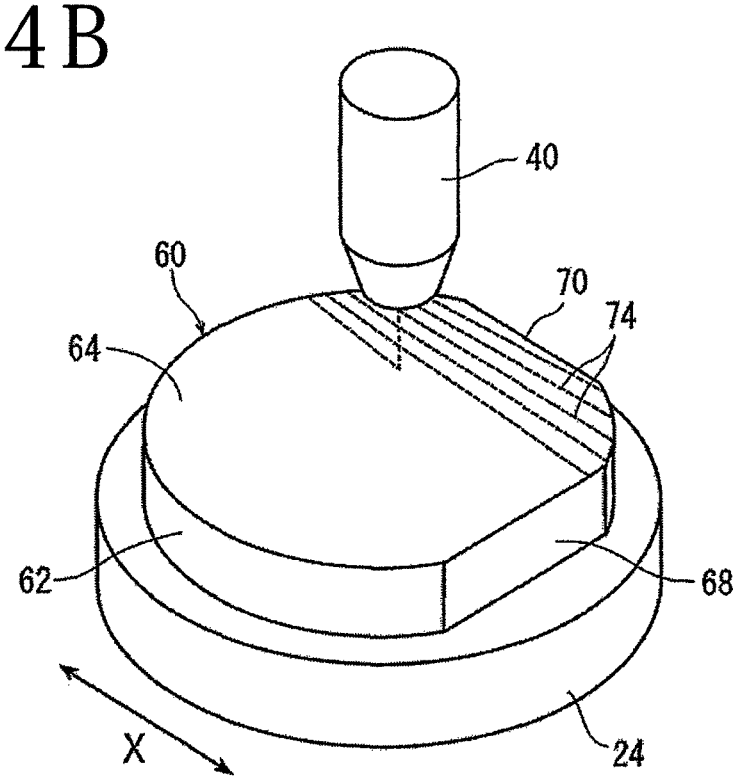
FIG. 4B is a perspective view showing the manner in which the sampling step is carried out on the single-crystal SiC ingot.
Figure 5A:
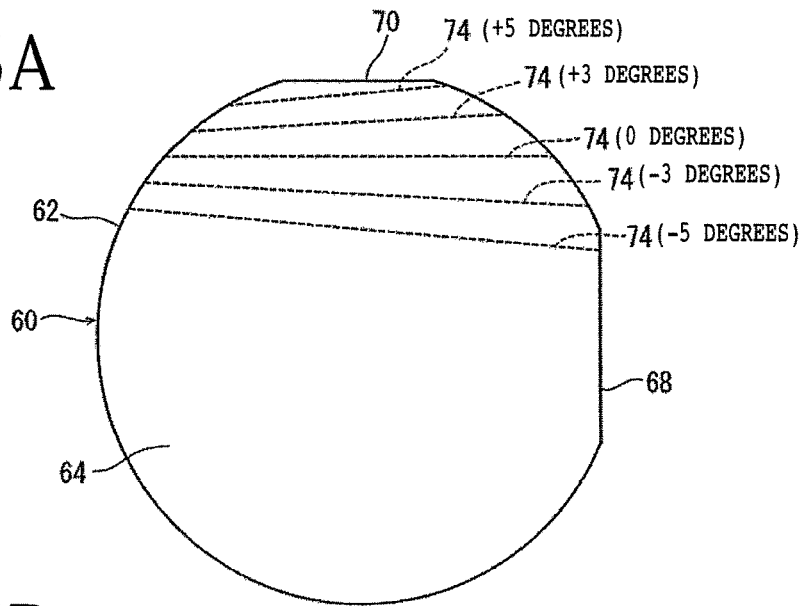
FIG. 5A is a plan view of the single-crystal SiC ingot on which the sampling step has been carried out.

The alignment step is followed by a processing feed direction detecting step which confirms whether or not the direction A in which the c-axis is inclined is perpendicular to the second orientation flat 70 and which detects a processing feed direction that is perpendicular to the direction A in which the c-axis is inclined at the time a wafer is produced from the ingot. The processing feed direction detecting step includes a sampling step and a determining step. In the sampling step, as shown in FIGS. 4A, 4B, and 5A, sampling irradiation is performed such that, while the chuck table 24 is being moved in the X directions at a predetermined processing feed speed by the X-direction moving means 26, the beam condenser 40 irradiates the ingot 60 with a pulse laser beam having a wavelength that transmits SiC, thereby forming a straight sampled reduced strength area 74 in the ingot 60 parallel to the upper surface 64 thereof. Specifically, the sampling irradiation is carried out a plurality of times when the beam condenser 40 scans the upper surface 64 of the ingot 60 along a direction parallel to the second orientation flat 70 and a plurality of directions inclined clockwise and counterclockwise by respective predetermined angles of 0.5 degrees, for example, from the second orientation flat 70 while the moving means 8 moves and rotates the chuck table 24, thereby forming a plurality of straight sampled reduced strength areas 74 in the ingot 60. The sampling irradiation is performed under the following processing conditions:

Laser beam wavelength: 1064 nm
Repetitive frequency: 80 kHz
Average output power: 3.2 W
Pulse duration: 3 nanoseconds
Focused spot diameter: 10 μm
Numerical aperture of condensing lens (NA): 0.65
Processing feed speed: 150 mm/second
Defocus: 90 μm The defocus referred to above represents a distance by which the beam condenser 40 moves toward the upper surface 64 of the ingot 60 from the position where the focused point of the pulsed laser beam is positioned on the upper surface 64.

Figure 5B:
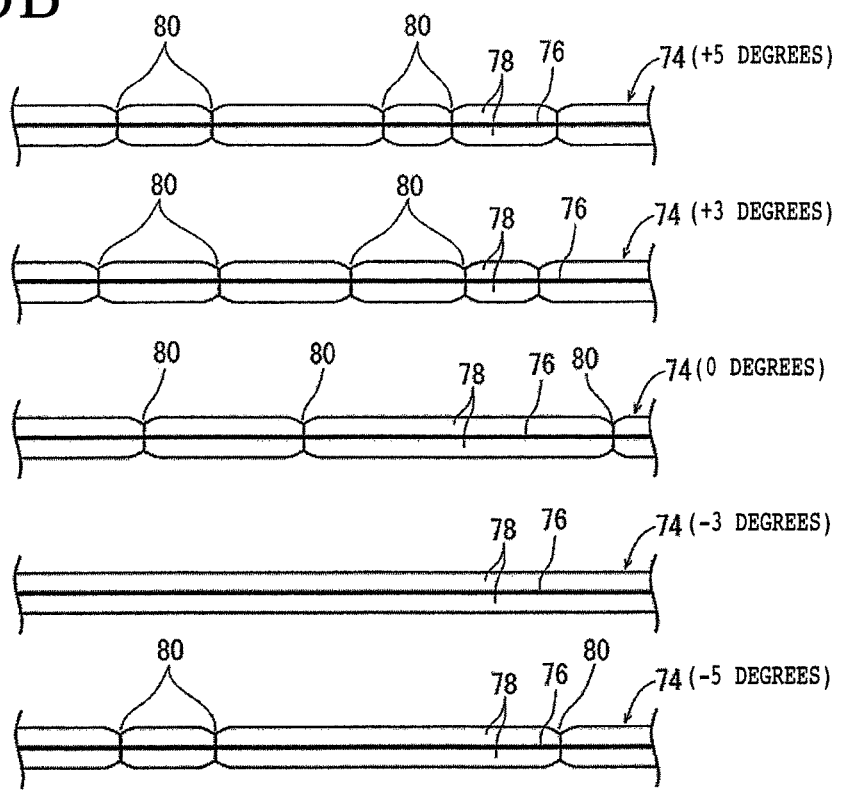
FIG. 5B is a schematic view of a plurality of sampled reduced strength areas.

In the processing feed direction detecting step, the sampling step is followed by the determining step. In the determining step, the chuck table 24 is moved under the imaging means 12 by the moving means 8, and the imaging means 12 captures an image of each of the sampled reduced strength areas 74. As shown in FIG. 5B, each of the sampled reduced strength areas 74 is made up of a modified layer 76 and cracks 78 propagated from the modified layer 76 along the c-plane on both sides of the modified layer 76. In FIGS. 5A and 5B, the sampled reduced strength area 74 formed parallel to the second orientation flat 70 is used as a reference (0 degrees), those sampled reduced strength areas 74 which are inclined clockwise from the reference sampled reduced strength area 74 as viewed on the upper surface 64 are indicated by respective angles with a sign "−," and those sampled reduced strength areas 74 which are inclined counterclockwise from the reference sampled reduced strength area 74 as viewed on the upper surface 64 are indicated by respective angles with a sign "+." The images captured by the imaging means 12 are displayed on the screen of the display means 14. The number of nodes 80 that exist per unit length, e.g., 10 mm, on each of the sampled reduced strength areas 74 is counted in the displayed images, and the direction in which the sampled reduced strength area 74 where the number of nodes 80 is zero extends, i.e., the direction indicated by the angle of −3 degrees in the illustrated embodiment, is determined as a processing feed direction.

The processing feed direction thus determined extends strictly perpendicularly to the c-axis of the ingot 60. Specifically, although the second orientation flat 70 should have been formed parallel to the processing feed direction, it has actually been formed with a deviation of 3 degrees from the processing feed direction. The inventor of the present invention has found that the sampled reduced strength area 74 that extends parallel to the processing feed direction is continuous and free of nodes 80 as the modified layer 76 and the cracks 78 are formed on the same c-plane, whereas those sampled reduced strength areas 74 that do not extend parallel to the processing feed direction have nodes 80 formed due to faults caused in the modified layer 76 and the cracks 78 because the focused point of the laser beam moves across two c-planes which are adjacent to each other at the atomic level. Since the direction in which the sampled reduced strength area 74 where the number of nodes 80 is zero extends is determined as a processing feed direction in the processing feed direction detecting step, it is possible to confirm whether or not the direction A in which the c-axis is inclined and the second orientation flat 70 are perpendicular to each other, and to detect a processing feed direction that is strictly perpendicular to the direction A in which the c-axis is inclined.

Figure 6:
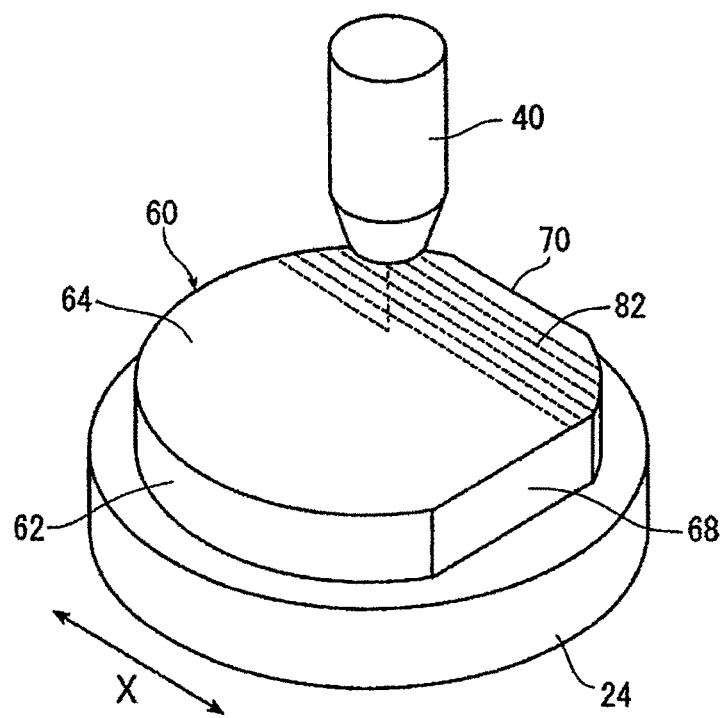
FIG. 6 is a perspective view showing the manner in which a peeling plane forming step is carried out on the single-crystal SiC ingot.
Figure 7A:
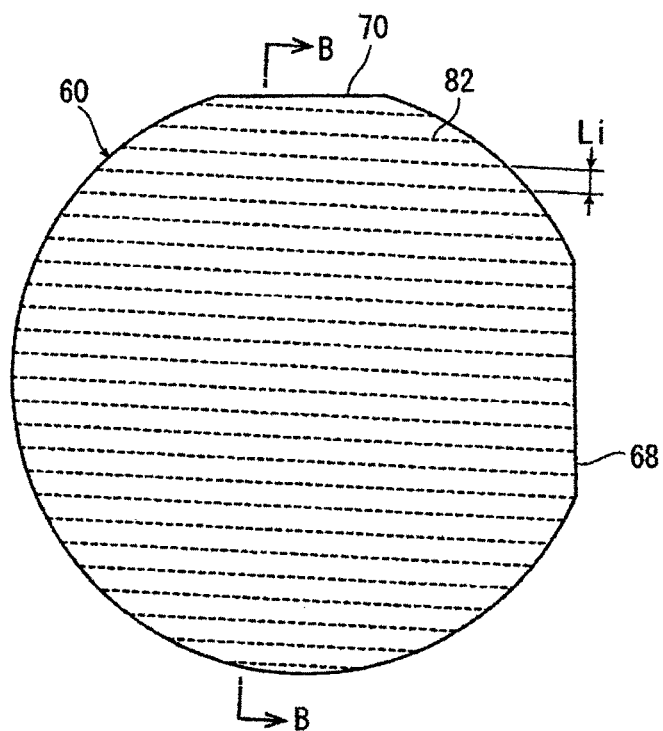
FIG. 7A is a plan view of the single-crystal SiC ingot on which the peeling plane forming step has been carried out.
Figure 7B:
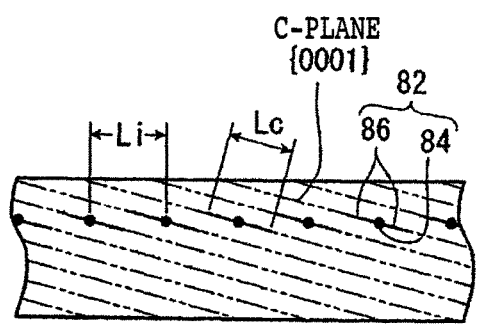
FIG. 7B is a fragmentary cross-sectional view of the single-crystal SiC ingot on which the peeling plane forming step has been carried out.

After the processing feed direction detecting step has been carried out, a peeling plane forming step is performed. In the peeling plane forming step, the moving means 8 moves and rotates the chuck table 24 to align the direction inclined 3 degrees counterclockwise as viewed on the upper surface 64 from the second orientation flat 70 with the X directions and to position the ingot 60 and the beam condenser 40 in alignment with each other. Then, the focused point position adjusting means moves the beam condenser 40 in the Z directions to adjust the focused point of a pulsed laser beam to a position at a depth from the upper surface 64, which depth corresponds to the thickness of a wafer to be produced. Then, a reduced strength area forming process is carried out. In the reduced strength area forming process, as shown in FIG. 6, while the chuck table 24 is being moved in the X directions at a predetermined processing feed speed by the X-direction moving means 26, the beam condenser 40 irradiates the ingot 60 with a pulse laser beam having a wavelength that transmits SiC, thereby forming a straight reduced strength area 82 in the ingot 60. Specifically, the reduced strength area forming process is carried out a plurality of times at predetermined intervals in the direction A in which the c-axis is inclined by causing the Y-direction moving means 28 to indexing-feed the chuck table 24 in one of the Y directions. The peeling plane forming step is performed under the following processing conditions:

Laser beam wavelength: 1064 nm
Repetitive frequency: 80 kHz
Average output power: 3.2 W
Pulse duration: 3 nanoseconds
Focused spot diameter: 10 μm
Numerical aperture of condensing lens (NA): 0.65
Indexed distance: 500 μm
Processing feed speed: 150 mm/second
Defocus: 90 μm As shown in FIGS. 7A and 7B, each of the reduced strength areas 82 formed at the depth corresponding to the thickness of a wafer to be produced in the reduced strength area forming process is made up of a modified layer 84 and cracks 86. Since the reduced strength areas 82 extend parallel to the upper surface 64, the modified layers 84 of the reduced strength areas 82 are positioned on the same c-plane. When each of the modified layers 84 is formed in the ingot 60, the cracks 86 are propagated from the modified layer 84 along the c-plane on both sides of the modified layer 84. The length of the crack 86 propagated on one side of each modified layer 84 is approximately 250 μm, and hence the length Lc of the cracks 86 on both sides of the modified layer 84 is approximately 500 μm. Therefore, when the indexed distance Li in the Y directions is approximately 500 μm as described above in the peeling plane forming step, a peeling plane is formed in the ingot 60 at a depth corresponding to the thickness of a wafer to be produced.

Figure 8:
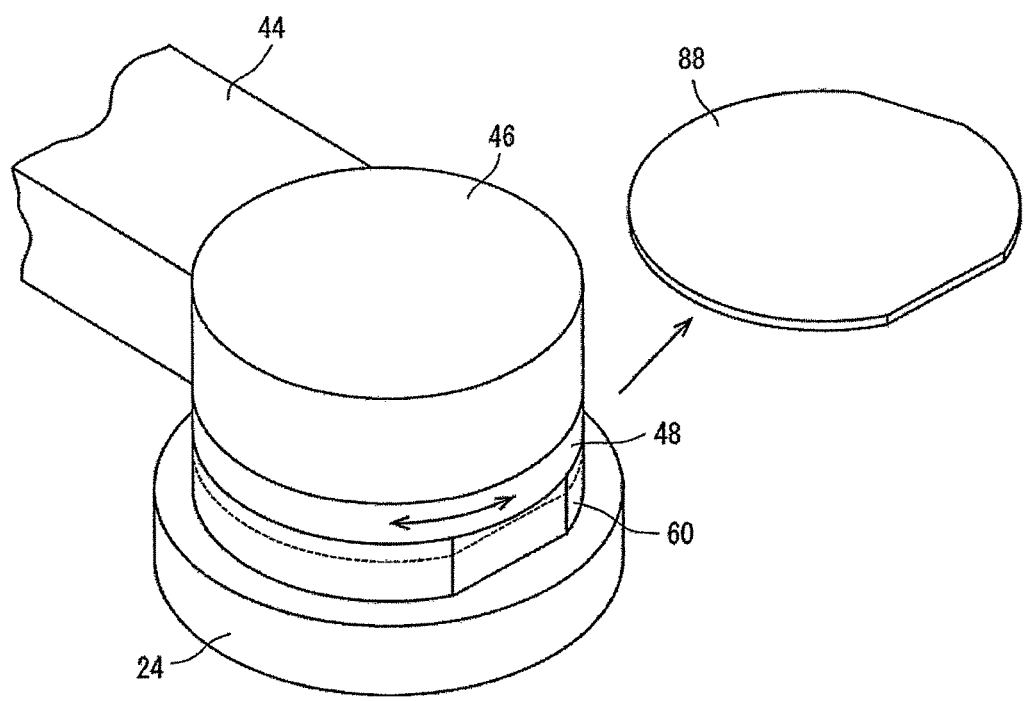
FIG. 8 is a perspective view showing the manner in which a wafer producing step is carried out.

The peeling plane forming step is followed by a wafer producing step. In the wafer producing step, the moving means 8 moves the chuck table 24 under the suction member 48, and the Z-direction moving means lowers the arm 44 until the lower surface of the suction member 48 is brought into intimate contact with the upper surface of the ingot 60 as shown in FIG. 8. Then, the suction means is actuated to develop a vacuum in the suction holes in the suction member 48, thereby enabling the lower surface of the suction member 48 to attract the upper surface of the ingot 60 under suction. Thereafter, the ultrasonic vibration applying means is actuated to apply ultrasonic vibrations to the lower surface of the suction member 48, and the motor 46 is energized to rotate the suction member 48 about its own axis. At this time, a disk-shaped portion of the ingot 60 attracted to the suction member 48 is peeled off from the peeling plane that serves as a boundary face, as a wafer 88 having a desired thickness. Therefore, the wafer 88 is efficiently produced from the ingot 60. After the wafer 88 has been produced, the exposed upper surface of the ingot 60 is polished by polishing means (not shown) on the base table 4, and the peeling plane forming step and the wafer producing step are performed again on the ingot 60, so that a plurality of wafers can be produced from the ingot 60. Accordingly, the amount of ingot material that has to be thrown away when a wafer is produced from the ingot 60 is reduced, and wafers can be produced from the ingot 60 with improved productivity. Since the processing feed direction detecting step has been carried out for the generation of the first wafer 88, the processing feed direction detecting step does not need to be repeated on the same ingot 60 for producing subsequent wafers therefrom.

The present invention is not limited to the details of the above described preferred embodiment. The scope of the invention is defined by the appended claims and all changes and modifications as fall within the equivalence of, the scope of the claims are therefore to be embraced by the invention.

What is claimed is:

1. A wafer producing method of producing a wafer from a cylindrical single-crystal SiC ingot having a cylindrical peripheral surface including a first orientation flat and a second orientation flat shorter than said first orientation flat and perpendicular to said first orientation flat, and a circular upper surface, said cylindrical single-crystal SiC ingot having a c-axis inclined from a vertical axis perpendicular to said circular upper surface toward said second orientation flat and an off-angle formed between a c-plane perpendicular to said c-axis and said upper surface, said wafer producing method comprising:

a processing feed direction detecting step of confirming whether or not a direction in which said c-axis is inclined and said second orientation flat are perpendicular to each other, and detecting a processing feed direction perpendicular to the direction in which said c-axis is inclined;

a reduced strength area forming step of positioning the focused point of a laser beam in said cylindrical single-crystal SiC ingot at a depth from said circular upper surface, which depth corresponds to the thickness of a wafer to be produced, and while relatively moving said cylindrical single-crystal SiC ingot and said focused point in said processing feed direction which has been detected in the processing feed direction detecting step, irradiating said cylindrical single-crystal SiC ingot with a laser beam having a wavelength that transmits through SiC, thereby forming a straight reduced strength area made up of a modified layer parallel to said circular upper surface and cracks extending from said modified layer along said c-plane at the depth corresponding to the thickness of the wafer to be produced;

a peeling plane forming step of forming a peeling plane in said cylindrical single-crystal SiC ingot by carrying out the reduced strength area forming step a plurality of times at predetermined intervals in a direction perpendicular to said processing feed direction; and a wafer producing step of, after the peeling plane forming step, producing a wafer from said cylindrical single-crystal SiC ingot by peeling off a portion of said cylindrical single-crystal SiC ingot from said peeling plane that serves as a boundary face;

wherein the processing feed direction detecting step includes:

a sampling step of performing sampling irradiation for positioning the focused point of a laser beam in said cylindrical single-crystal SiC ingot at a predetermined depth from said circular upper surface and, while moving said cylindrical single-crystal SiC ingot and said focused point relatively to each other, irradiating said cylindrical single-crystal SiC ingot with a laser beam having a wavelength that transmits through SiC, along a direction parallel to said second orientation flat and a plurality of directions inclined clockwise and counterclockwise by respective predetermined angles from said second orientation flat, thereby forming a plurality of straight sampled reduced strength areas in said cylindrical single-crystal SiC ingot, each of said straight sampled reduced strength areas being made up of a modified layer parallel to said circular upper surface and cracks extending from said modified layer along said c-plane, and a determining step of capturing respective images of said straight sampled reduced strength areas with imaging means, measuring the number of nodes which exist per unit length on each of said straight sampled reduced strength areas in one of the images thereof, and determining a direction in which the straight sampled reduced strength area where the measured number of nodes is zero extends as a processing feed direction.

2. A processing feed direction detecting method of detecting a processing feed direction in producing a wafer from a cylindrical single-crystal SiC ingot having a cylindrical peripheral surface including a first orientation flat and a second orientation flat shorter than said first orientation flat and perpendicular to said first orientation flat, and a circular upper surface, said cylindrical single-crystal SiC ingot having a c-axis inclined from a vertical axis perpendicular to said circular upper surface toward said second orientation flat and an off-angle formed between a c-plane perpendicular to said c-axis and said upper surface, said processing feed direction detecting method comprising:

a sampling step of performing sampling irradiation for positioning the focused point of a laser beam in said cylindrical single-crystal SiC ingot at a predetermined depth from said circular upper surface and, while moving said cylindrical single-crystal SiC ingot and said focused point relatively to each other, irradiating said cylindrical single-crystal SiC ingot with a laser beam having a wavelength that transmits through SiC, along a direction parallel to said second orientation flat and a plurality of directions inclined clockwise and counterclockwise by respective predetermined angles from said second orientation flat, thereby forming a plurality of straight sampled reduced strength areas in said cylindrical single-crystal SiC ingot, each of said straight sampled reduced strength areas being made up of a modified layer parallel to said circular upper surface and cracks extending from said modified layer along said c-plane; and a determining step of capturing respective images of said straight sampled reduced strength areas with imaging means, measuring the number of nodes which exist per unit length on each of said straight sampled reduced strength areas in one of the images thereof, and determining a direction in which the straight sampled reduced strength area where the measured number of nodes is zero extends as a processing feed direction.

* * * * *